United States Patent
Singh et al.

(10) Patent No.: US 11,152,496 B2
(45) Date of Patent: Oct. 19, 2021

(54) IC STRUCTURE BASE AND INNER E/C MATERIAL ON RAISED INSULATOR, AND METHODS TO FORM SAME

(71) Applicant: GLOBALFOUNDRIES U.S. INC., Santa Clara, CA (US)

(72) Inventors: Jagar Singh, Clifton Park, NY (US); Alexander L. Martin, Greenfield Center, NY (US); Alexander M. Derrickson, Troy, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 16/776,930

(22) Filed: Jan. 30, 2020

(65) Prior Publication Data
US 2021/0242335 A1 Aug. 5, 2021

(51) Int. Cl.
*H01L 29/66* (2006.01)
*H01L 29/02* (2006.01)
(Continued)

(52) U.S. Cl.
CPC .......... *H01L 29/735* (2013.01); *H01L 21/266* (2013.01); *H01L 21/26513* (2013.01);
(Continued)

(58) Field of Classification Search
CPC .......... H01L 29/6625; H01L 29/66242; H01L 29/66318; H01L 29/737; H01L 29/0808; H01L 29/0821; H01L 29/1008; H01L 29/0649; H01L 29/0684; H01L 29/165; H01L 29/70; H01L 29/205; H01L 29/73; H01L 29/7317; H01L 29/735; H01L 29/45; H01L 2924/1305; H01L 2924/13051; H01L 21/266; H01L 21/26506; H01L 21/28518; H01L 21/308; H01L 21/3081; H01L 21/30621; H01L 21/3065; H01L 21/26513; H01L 21/26586; H01L 21/735; H01L 21/45; H01L 21/02107; H01L 21/02109; H01L 21/02112;
(Continued)

(56) References Cited

U.S. PATENT DOCUMENTS 7,763,518 B2    7/2010  Ho et al.
9,397,203 B2 *  7/2016  Colt, Jr. .............. H01L 29/6625
(Continued)

OTHER PUBLICATIONS

Hashemi et al., "Demonstration of Symmetric Lateral NPN Transistors on SOI Featuring Epitaxially Grown Emitter/Collector Regions," Journal of the Electron Devices Society, May 7, 2018, vol. 6, pp. 537-542.

*Primary Examiner* — Natalia A Gondarenko
(74) *Attorney, Agent, or Firm* — Hoffman Warnick LLC

(57) ABSTRACT

Embodiments of the disclosure provide an integrated circuit (IC) structure, including: a semiconductor base on a first portion of a raised region of an insulative layer; a first inner emitter/collector (E/C) material on a second portion of the raised region of the insulative layer, wherein the inner E/C material is directly horizontally between the semiconductor base and a sidewall of the raised region; and a first outer E/C material on a first non-raised region of the insulative layer, wherein an upper portion of the first outer E/C material is adjacent the first inner E/C material.

20 Claims, 10 Drawing Sheets

(51) Int. Cl.
  *H01L 29/08* (2006.01)
  *H01L 29/735* (2006.01)
  *H01L 29/737* (2006.01)
  *H01L 21/8222* (2006.01)
  *H01L 29/06* (2006.01)
  *H01L 29/10* (2006.01)
  *H01L 21/265* (2006.01)
  *H01L 21/266* (2006.01)
  *H01L 21/3065* (2006.01)
  *H01L 21/308* (2006.01)
  *H01L 21/285* (2006.01)
  *H01L 29/45* (2006.01)

(52) U.S. Cl.
  CPC ...... *H01L 21/28518* (2013.01); *H01L 21/308* (2013.01); *H01L 21/3065* (2013.01); *H01L 29/0649* (2013.01); *H01L 29/0808* (2013.01); *H01L 29/0821* (2013.01); *H01L 29/1008* (2013.01); *H01L 29/45* (2013.01); *H01L 29/6625* (2013.01)

(58) Field of Classification Search
  CPC ......... H01L 21/02123; H01L 21/02126; H01L 21/02164; H01L 21/0217; H01L 21/0245; H01L 21/02595; H01L 21/76251
  USPC ........ 257/526, 565, 586; 438/309, 320, 361, 438/364
  See application file for complete search history.

(56) References Cited

U.S. PATENT DOCUMENTS

| | | |
|---|---|---|
| 9,905,668 B2 | 2/2018 | Singh |
| 2018/0166563 A1* | 6/2018 | Balakrishnan .... H01L 21/02595 |
| 2019/0312126 A1* | 10/2019 | Shiu .................. H01L 21/30621 |

* cited by examiner

IC STRUCTURE BASE AND INNER E/C MATERIAL ON RAISED INSULATOR, AND METHODS TO FORM SAME

TECHNICAL FIELD

Embodiments of the disclosure relate generally to integrated circuits (ICs). More specifically, the disclosure relates to an integrated circuit structure with a base and an emitter/collector (E/C) material on a raised insulator, and methods to form the same.

BACKGROUND

In the microelectronics industry as well as in other industries involving construction of microscopic structures, there is a continued desire to reduce the size of structural features and microelectronic devices and/or to provide a greater amount of circuitry for a given chip size. Miniaturization in general allows for increased performance (more processing per clock cycle and less heat generated) at lower power levels and lower cost. Present technology is at atomic level scaling of certain micro-devices such as logic gates, bipolar junction transistors (BJTs), FETs, and capacitors. Circuit chips with hundreds of millions of such devices are common.

In the case of BJTs, controlling the resistance and parasitic capacitance across the component diodes of the transistor present challenges when operating at high frequencies. The parasitic capacitance from emitter to base, and from base to collector, may be particularly significant metrics because multiple diode junctions contribute to the parasitic capacitance of the BJT. Conventional approaches for limiting the capacitance and resistance of a BJT may be ineffective due to the reduced amount of space at higher device densities.

SUMMARY

Aspects of the disclosure provide an integrated circuit (IC) structure, including: a semiconductor base on a first portion of a raised region of an insulative layer; a first inner emitter/collector (E/C) material on a second portion of the raised region of the insulative layer, wherein the inner E/C material is directly horizontally between the semiconductor base and a sidewall of the raised region; and a first outer E/C material on a first non-raised region of the insulative layer, wherein an upper portion of the first outer E/C material is adjacent the first inner E/C material.

Further aspects of the disclosure provide an integrated circuit (IC) structure, including: a semiconductor base on an insulative layer; a first inner emitter/collector (E/C) material on the insulative layer adjacent a first sidewall of the semiconductor base; and a first outer E/C material on the insulative layer adjacent the first inner E/C material, wherein a height of the first outer E/C material above the insulative layer is greater than a height of the first inner E/C material above the insulative layer.

Another aspect of the disclosure provides a method of forming an integrated circuit (IC) structure, the method including: providing a structure including: an insulative layer on a substrate, the insulative layer including a first region and a second region adjacent the first region, a semiconductor base on a portion of an upper surface of the first region of the insulative layer, and a first inner emitter/collector (E/C) material on the portion of the upper surface of the first region of the insulative layer and adjacent a first sidewall of the semiconductor base; partially recessing the second region of the insulative layer above the substrate to convert the first region of the insulative layer into a raised region adjacent the second region; and forming an outer E/C material on the recessed second region of the insulative layer, wherein the first outer E/C material is directly adjacent the first inner E/C material.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
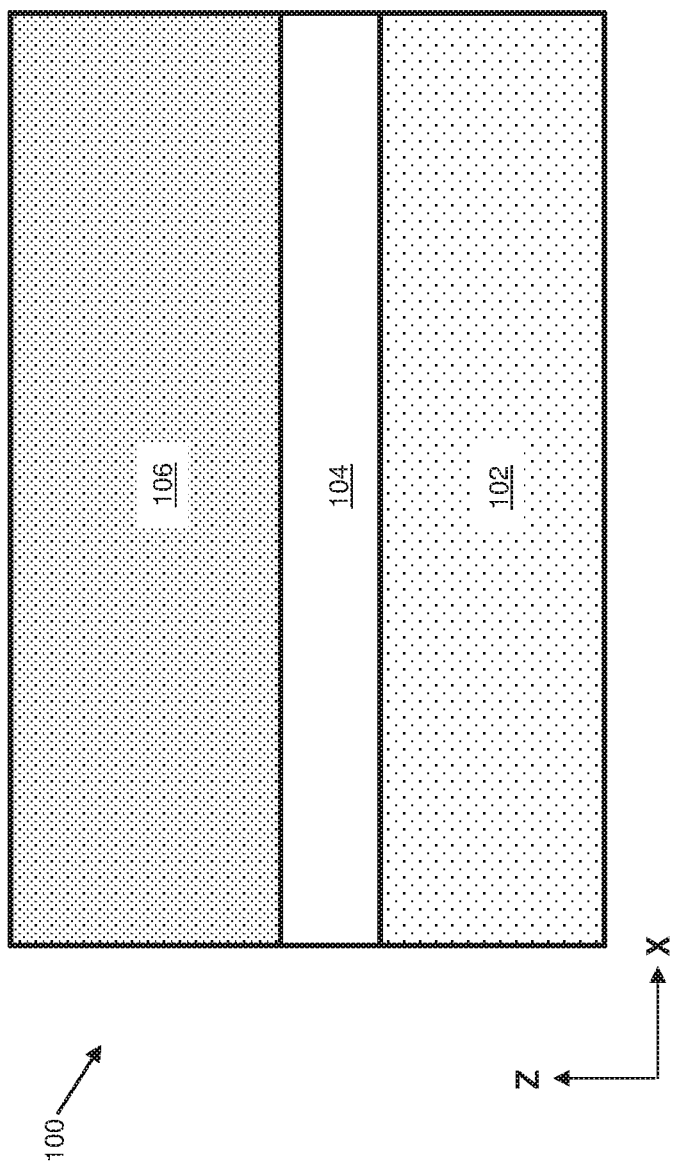
FIG. 1 shows a cross-sectional view in the X-Z plane of a first initial structure to be processed according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the disclosure provide an integrated circuit (IC) structure with a raised insulative layer for reducing the parasitic capacitances of a bipolar junction transistor (BJT) formed thereon. Embodiments of the disclosure include semiconductor materials formed on an insulative layer having a raised region located adjacent or between non-raised regions of the insulative layer. A semiconductor base and inner emitter/collector (E/C) material may be located on an upper surface of the raised region. Outer E/C material for the BJT may be formed on one or more non-raised regions of the insulative layer. The raised region of the insulative layer may cause at least the inner E/C material to be significantly smaller in height than the outer E/C material, and thus may reduce the parasitic capacitance and resistance across P-N junctions of the BJT, e.g., from emitter to base and/or from collector to base. Embodiments of the disclosure can be implemented in any conceivable type of BJT, including N-P-N junction BJTs and/or P-N-P junction BJTs.

Referring to FIG. 1, embodiments of the disclosure provide methods to form an IC structure. FIG. 1 illustrates, in plane X-Z, an initial structure 100 (simply "structure" hereafter) capable of being processed to form an IC structure according to embodiments of the disclosure. Structure 100 may be formed on a substrate 102 including, e.g., one or more semiconductor materials. Substrate 102 can include any currently known or later-developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The entirety of substrate 102 or a portion thereof may be strained.

An insulative layer 104, also known in the art as a "buried oxide," "buried insulator," or "BOX" layer, can be located on substrate 102. Insulative layer 104 may include one or more oxide compounds, and/or any other currently known or later-developed electrically insulative substances. Insulative layer 104 may be sized as narrow as possible to provide better interaction with semiconductor materials formed thereon, and in various embodiments may have a thickness R that is at most approximately twenty-five nanometers (nm). Advantages to limiting the thickness of insulative layer 104 may include, e.g., stronger dissipation of heat from overlying structures through insulative layer 104. A BJT in particular will produce more heat than other transistor structures, particularly at its base-collector junction, and thus may benefit from insulative layer 104 being at most approximately twenty-five nm. These thermal characteristics may provide improved transistor performance during operation.

A precursor active semiconductor material 106 may be formed on substrate 102, e.g., to provide precursor material for base and/or emitter/collector regions of a BJT as discussed herein. Portions of precursor active semiconductor material 106 may be introduced with P-type dopants to change its electrical properties. The doping of precursor semiconductor material 106 with P-type and N-type dopants is a foundational process to form a BJT. Doping is the process of introducing impurities (dopants) into the semiconductor substrate, or elements formed on the semiconductor substrate, and is often performed with a mask (or previously-formed, elements in place) so that only certain areas of the substrate will be doped. A "dopant" refers to an element introduced into a semiconductor to establish either P-type (acceptors) or N-type (donors) conductivity. Dopants are of two types: "donors" and "acceptors." N type dopants are donors and P type dopants are acceptors. In the case of a silicon substrate, common dopants may include, e.g., boron (B), and/or indium (In), for P-type doping. For N-type doping, the doped element(s) may include, for example, phosphorous (P) arsenic (As), and/or antimony (Sb). P-type and N-type doping types may themselves may be further characterized by their doping intensity relative to a baseline doping concentration for the material. P-type doped materials with an elevated number of "holes," i.e., charge carriers having a positive charge, are classified as being P+ doped. P-type doped materials carrying a greatly diminished number of electrons are classified as being P− doped. N-type doped materials with an elevated number of electrons are classified as being N+ doped. N-type doped materials carrying a greatly diminished number of holes are classified as being N− doped.

Figure 2:
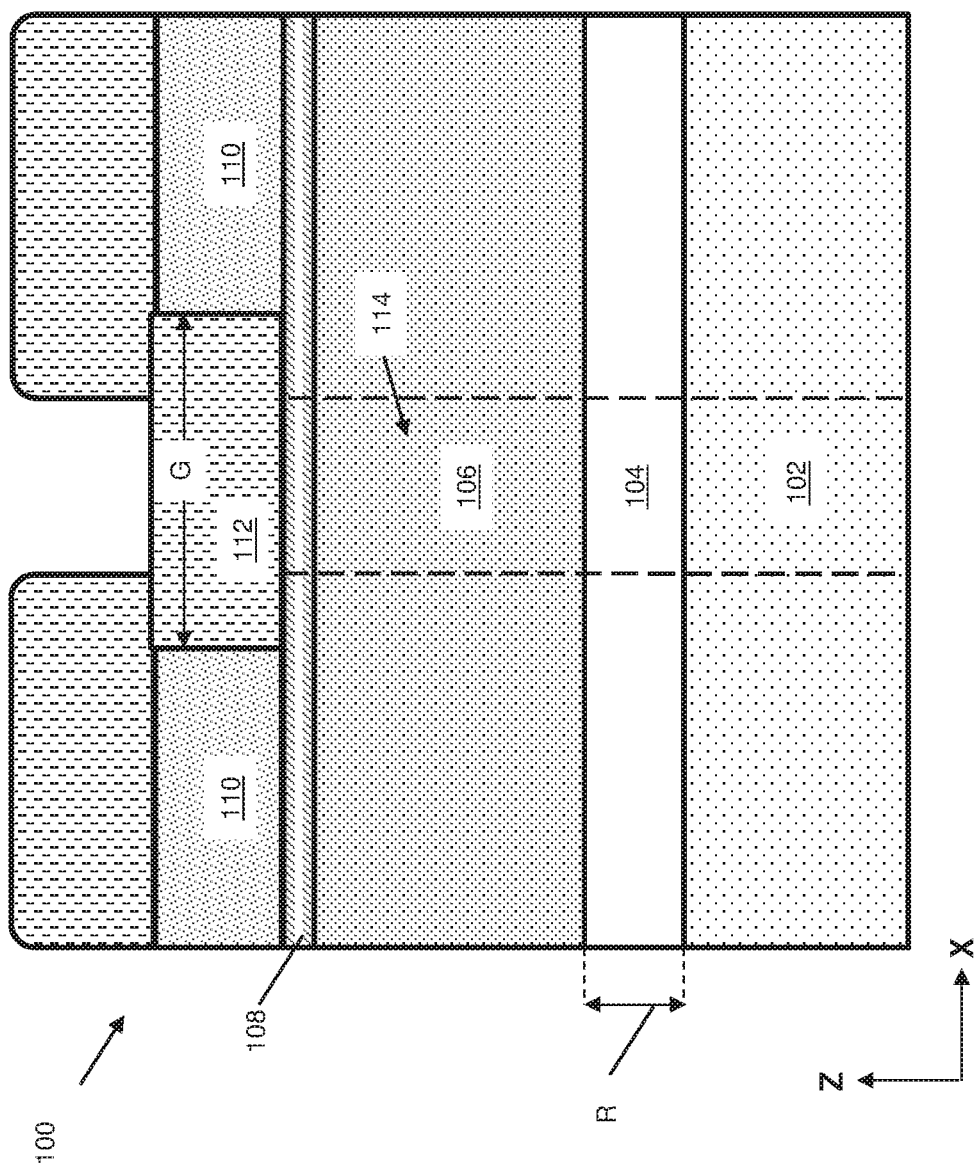
FIG. 2 shows a cross-sectional view of forming first and second masks on the structure according to embodiments of the disclosure.

Referring to FIG. 2, structure 100 may be processed or otherwise modified to target selected materials for implantation, removal, epitaxial growth, etc. Although FIG. 2 illustrates an example set of processes to process structure 100 according to embodiments of the disclosure, it is understood that structure 100 may be provided and/or processed by other methodologies to provide features similar to, or the same as, various features described herein. Embodiments of the disclosure may include forming a first mask 108 on precursor active region. First mask 108 may take the form of a pad nitride, oxide, and/or other preliminary masking material suitable to protect selected portions of precursor active semiconductor material 106 from some types of downward directional etching and/or other processes to form or remove material.

Etching generally refers to the removal of material from a substrate, e.g., substrate 102, or structures formed on the substrate. Etching is often performed with a mask (e.g., first mask 108) in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce narrow features, e.g., trenches or raised portions of a previously formed material (e.g., insulative layer 104 and/or precursor active semiconductor material 106).

After first mask 108 is formed, further processing may target selected materials below first mask 108 for removal, e.g., by etching. Various embodiments of the disclosure may include depositing one or more amorphous silicon (a-Si) layers 110 on first mask 108. The location of a-Si layers 110 may be selected, e.g., based on the intended location of emitter and/or collector terminals of a BJT formed from insulative layer 104 and precursor active semiconductor material 106. Specifically, each a-Si layer 110 may be positioned over the target location of an emitter or collector terminal for a BJT. One a-Si layer 110 may be positioned over the location of an emitter terminal of the BJT, while another a-Si layer 110 may be positioned over the location of a collector terminal of the BJT.

Embodiments of the disclosure may also include forming a photoresist 112 on first mask 108, and to cover a-Si layers 110 where applicable. Photoresist 112 may take the form of, e.g., a radiation sensitive "resist" coating formed over first mask 108. Photoresist 112 may include, e.g., tetraethyl orthosilicate (TEOS) and/or other materials which may be conformally deposited onto first mask 108 and/or a-Si layers 110. Photoresist 112, is itself first patterned by exposing it to radiation, where the radiation (selectively) passes through an intervening mask or template containing the pattern. As a result, the exposed or unexposed areas of photoresist 112 become more or less soluble, depending on the type of photoresist used. A developer is then used to remove the more soluble areas of the resist leaving a patterned resist. The patterned resist can then serve as a mask for the underlying layers (e.g., precursor active semiconductor material 106) which can then be selectively treated, such as to receive ions for doping and/or to undergo etching, for example.

Figure 3:
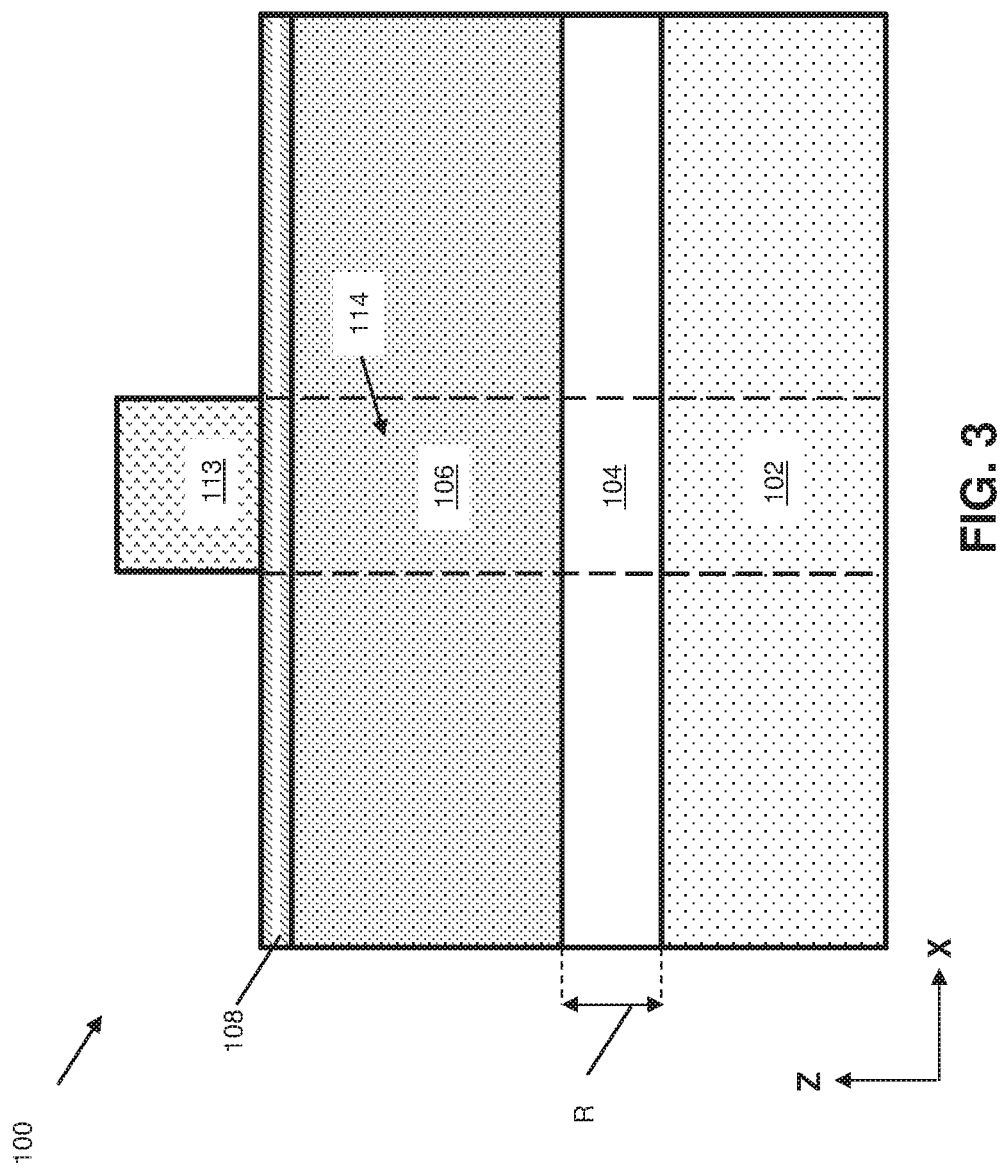
FIG. 3 shows a cross-sectional view of removing portions of the second mask according to embodiments of the disclosure.

Referring to FIGS. 2 and 3 together, the previous formation of a-Si layers 110 may convert portions of photoresist 112 (FIG. 2 only) into a second mask 113 (FIG. 3 only) thereon. Non-converted portions of photoresist 112 may be removed by stripping, planarization, etc. Next, as indicated by FIG. 3, a-Si layers 110 (FIG. 2 only) may be selectively removed to expose first mask 108. A portion of second mask 113 remains intact above only an intermediate portion 114 of precursor active semiconductor material 106. Intermediate portion 114 may be smaller than the horizontal gap G between a-Si layers 110, e.g., due to the original photoresist 112 being formed by conformal deposition on and alongside a-Si layers 110. The presence of first mask 108 may protect precursor active semiconductor material 106 from being etched, modified, etc., as a-Si layer(s) 110 and second mask 112 are formed and processed. In this state, second mask 113 will protect intermediate portion 114 from being affected by subsequent etching, while other portions of precursor active semiconductor material 106 and first mask 108 may be susceptible to downward directional etching (e.g., RIE).

Figure 4:
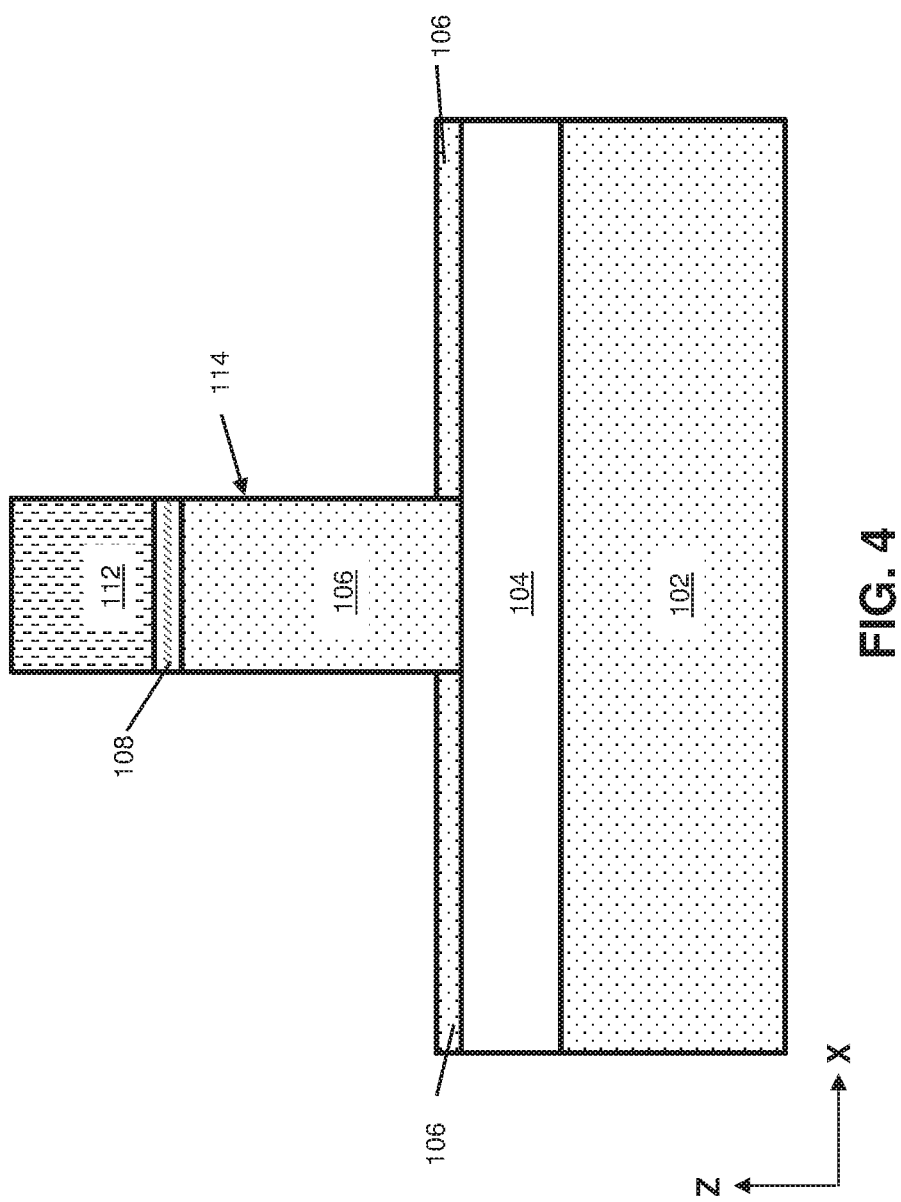
FIG. 4 shows a cross-sectional view of removing portions of a precursor active semiconductor material according to embodiments of the disclosure.

Referring to FIG. 4, continued processing according to the disclosure may include, e.g., removing exposed portions of first mask 108 and at least partial etching of precursor active semiconductor material 106 thereunder. The etching of precursor active semiconductor material 106 and first mask 108 may be implemented via a single downward directional etching, e.g., with a material incapable of significantly affecting second mask 112. In further examples, exposed portions of first mask 108 may be removed by a first etchant specific to the composition of first mask 108, and underlying portions of precursor active semiconductor material 106 may be removed subsequently by a second, different etchant. In any case, at least a portion of precursor active semiconductor material 106 may remain intact on insulative layer 104 after the etching concludes. In alternative examples, all of precursor active semiconductor material 106 not positioned below second mask 112 may be removed. In any case, precursor active semiconductor material 106 of intermediate portion 114 may remain intact and may be covered by both first mask 108 and second mask 112. As will be discussed herein, precursor active semiconductor material 106 may be used to form emitter and/or collector material for a BJT, while precursor active semiconductor material 106 of intermediate portion 114 may be used to form the base material for a BJT. Further discussion is provided with respect to the processing of both emitter and collector materials, but it is understood that embodiments of the disclosure may be implemented solely to form an emitter or collector of a BJT with different characteristics and/or dimensions as compared to other terminal.

Figure 5:
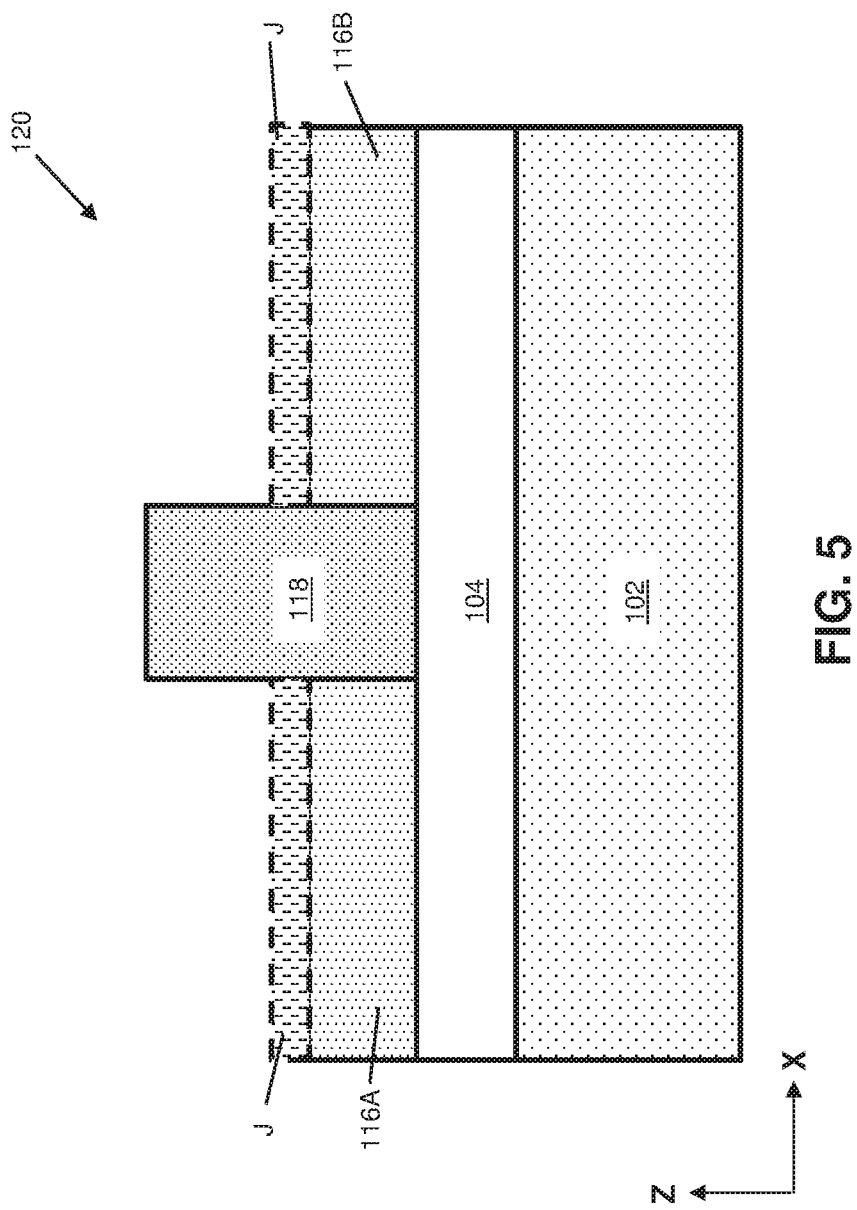
FIG. 5 shows a cross-sectional view of forming a semiconductor base and emitter/collector (E/C) material from the precursor active semiconductor material according to embodiments of the disclosure.

Referring to FIGS. 4 and 5, embodiments of the disclosure may include converting selected portions of precursor active semiconductor material 106 (FIG. 4 only) into one or more terminals of a BJT. For instance, precursor active semiconductor material 106 not covered by second mask 112 (FIG. 4 only) may be epitaxially grown, and/or may have additional semiconductor material deposited thereon, to increase the height of targeted semiconductor material above insulative layer 104. In some cases, precursor active semiconductor material 106 may not undergo further epitaxial growth and/or deposition. In any case, portions of precursor active semiconductor material 106 not covered by second mask 112 may receive dopants of a particular doping type (e.g., N-type dopants, or more specifically N− dopants) to form a first inner emitter/collector (E/C) material 116A and a second inner E/C material 116B over insulative layer 104.

Embodiments of the disclosure may include, e.g., before or after the forming of inner E/C materials 116A, 116B, removing second mask 112 and first mask 108 thereunder to re-expose the underlying portion of precursor active semiconductor material 106. At this stage, embodiments of the disclosure may include selectively introducing dopants of another doping type (e.g., P-type dopants, or more specifically P− dopants) into the exposed precursor active semiconductor material 106 to form a semiconductor base 118 (FIG. 5 only) horizontally between first and second E/C materials 116A, 116B. The introducing of dopants into semiconductor base 118 may be implemented, e.g., with a temporary mask J (shown in phantom) over inner E/C materials 116A, 116B to prevent significant amounts of the introduced dopant from entering inner E/C material(s) 116A, 116B as semiconductor base 118 is doped. The forming of inner E/C material(s) 116A, 116B and semiconductor base 118 will create an intermediate structure 120 which can be further processed in various embodiments to yield a BJT. Further processing according to the disclosure may include removing and/or changing portions of insulative layer 104 to affect the shape and size of each terminal in a BJT.

Figure 6:
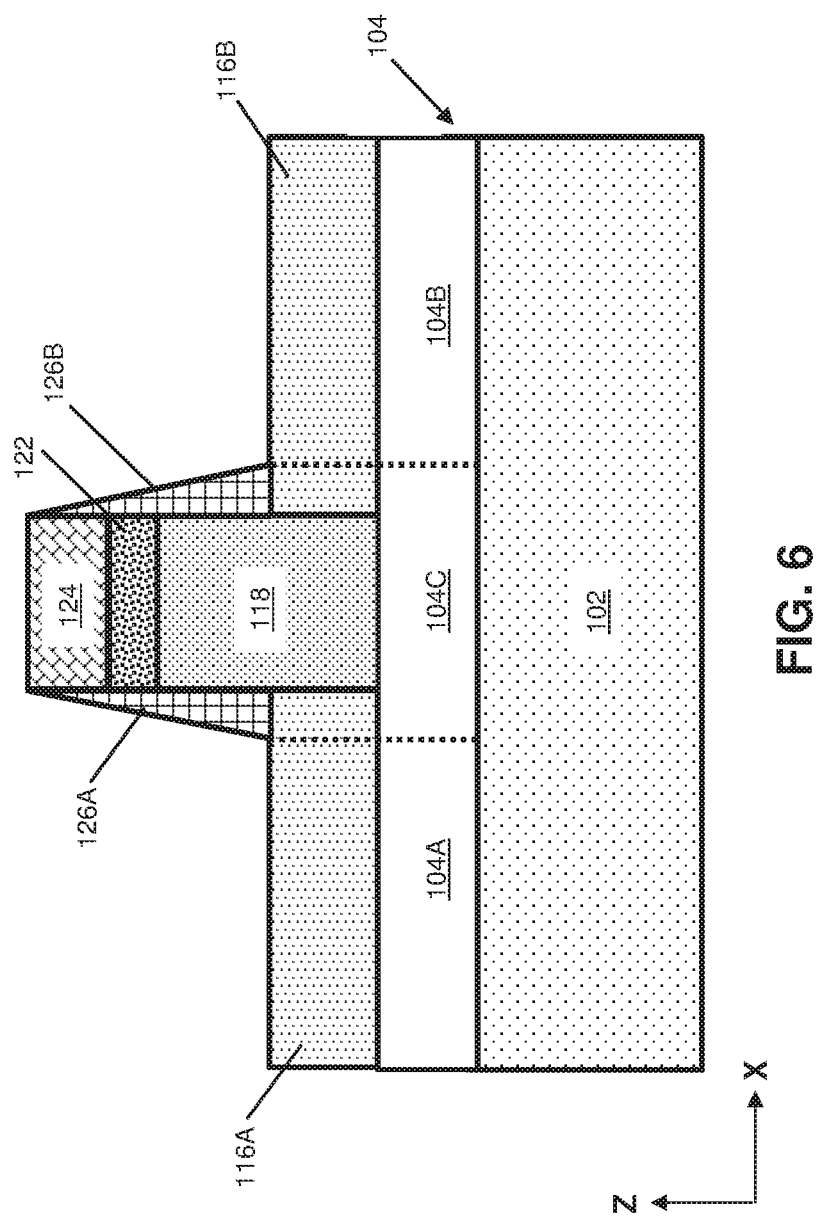
FIG. 6 shows a cross-sectional view of forming spacers and an insulative cap on the semiconductor base according to embodiments of the disclosure.

Referring to FIG. 6, embodiments of the disclosure may include forming additional materials on semiconductor base 118 to provide selected portions of a BJT structure, and to protect semiconductor base 118 as various E/C materials and components are formed. According to an example, an overlying base 122 may be formed selectively on an upper surface of semiconductor base 118, e.g., by selectively introducing additional dopants into semiconductor base 118, epitaxially growing additional doped material thereon, and/or otherwise depositing additional semiconductor material onto semiconductor base 118. Overlying base 122 in any case may be of the same doping type as semiconductor base 118 thereunder. In cases where semiconductor base 118 includes P− dopants, overlying base 122 may be doped with P+ dopants. Overlying base 122, as discussed elsewhere herein, may provide a conductive pathway between semiconductor base 118 and one or more subsequently-formed base contacts to control the operation of a BJT.

Additional materials formed over, and/or alongside, semiconductor base 118 may include an insulative cap 124 above semiconductor base 118 and/or overlying base 122. Insulative cap 124 may include any currently known or later developed insulative material including, e.g., one or more insulative materials described elsewhere herein with respect to insulative layer 104, first mask 108 (FIGS. 1-4), second mask 112 (FIGS. 1-3), etc. In still further examples, insulative cap 124 may include a layer of borosilicon glass (BSG), and/or one or more oxide insulators, selectively deposited over or otherwise formed exclusively above semiconductor base 118 and/or overlying base 122.

Embodiments of the disclosure may also include forming a first spacer 126A and/or a second spacer 126B on respective sidewalls of semiconductor base 118 and/or overlying base 122. Spacers 126A, 126B may include one more oxide-based insulators and/or other types of insulative materials. In a specific example, spacers 126A, 126B may include oxide insulators conformally deposited onto exposed sidewalls of semiconductor base 118 and/or overlying base 122.

Some portions of inner E/C material 116A, 116B will be covered by spacer 126A, 126B while other portions of inner E/C material 116A, 116B will remain exposed. The location of spacers 126A, 126B may subdivide the underlying insulative layer 104 into a first region 104A, a second region 104B, and an intermediate region 104C between first region 104A and second region 104B. In subsequent processing, portions of first inner E/C material 116A and second inner E/C material 116B not covered by spacers 126A, 126B, and regions 104A, 104B of insulative layer 104 thereunder will be susceptible to etching.

Figure 7:
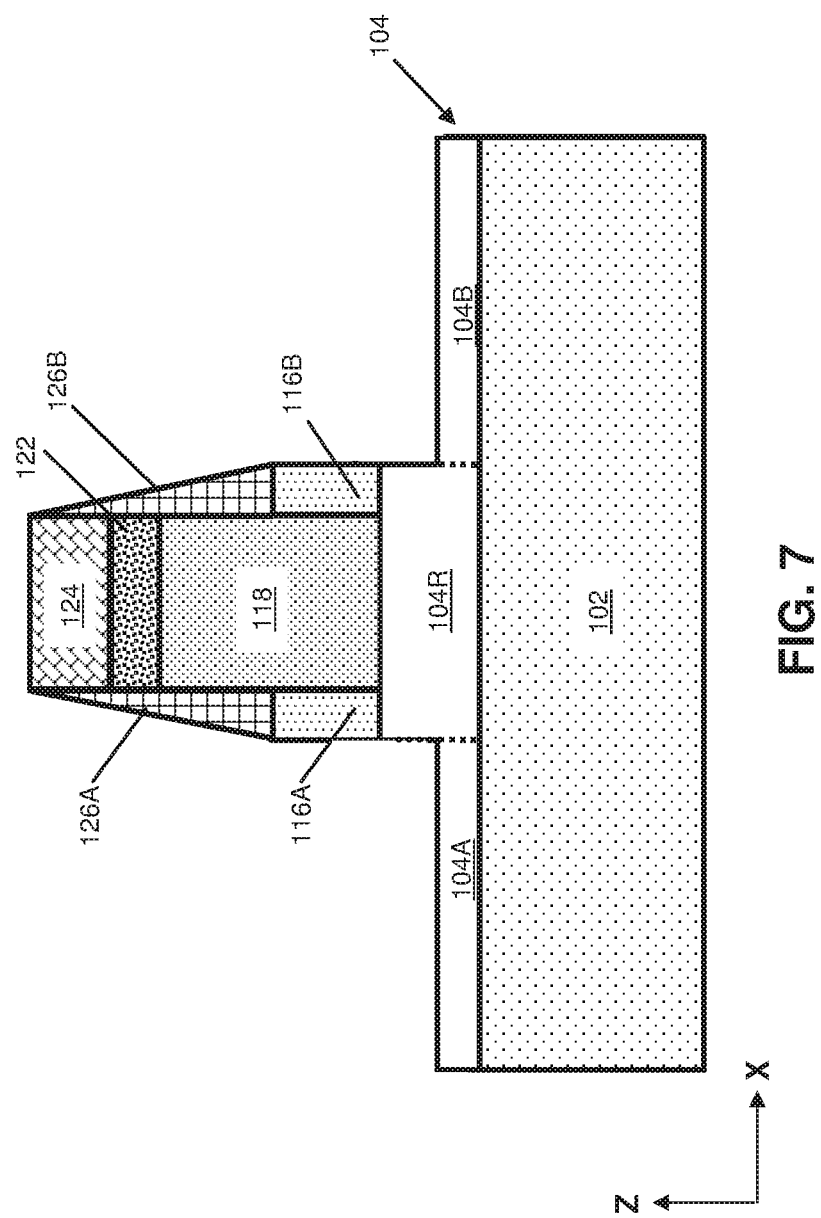
FIG. 7 shows a cross-sectional view of processing an insulative layer to form a raised intermediate region according to embodiments of the disclosure.

Turning to FIG. 7, continued processing according to the disclosure may include downward etching of first inner E/C material 116A and second inner E/C material 116B, e.g., by downward directional etching with one or more etchants selective to semiconductor materials. Portions of E/C material 116A, 116B covered by spacers 126A, 126B and/or insulative cap 124 will remain intact even as other portions of the same material are removed by etching. FIG. 7 also depicts, e.g., partial recessing of first region 104A and second region 104B of insulative layer 104. The partial recessing of insulative layer 104 may be accomplished, e.g., by continuing the downward directional etching after exposed portions of E/C material 116A, 116B have been removed, and/or by implementing an additional etching with different etchants specific to the composition of insulative layer 104.

At least a portion of first region 104A and second region 104B may remain intact after the etching concludes, e.g., by controlling an etch rate and/or etch time for removing the overlying portions of first region 104A and second region 104B. First spacer 126A, second spacer 126B, and insulative cap 124 may protect third region 104C (FIG. 6) of insulative layer 104 from being recessed concurrently with first region 104A and second region 104C. Thus, third region 104C may become a raised region 104R of insulative layer 104 adjacent or between first region 104A and/or second region 104B. After the recessing concludes, insulative layer 104 is prepared for the subsequent forming of additional E/C materials for a BJT. Although first region 104A and second region 104B are shown by example to be of similar vertical thickness, the thicknesses of first region 104A and second region 104B may be asymmetrical in some cases, e.g., to control the electrical properties of an overlying emitter or collector, and/or to control the dissipation of heat through insulative layer 104. In still further examples, either of first region 104A or second region 104B may be non-recessed, such that their vertical thickness is approximately equal to intermediate region 104R. Regardless of differences in thickness between first region 104A, second region 104B, and/or raised region 104R, insulative layer 104 and its various regions may remain in the form of a single, continuous material without physical interfaces and/or compositional differences between each region 104A, 104B, 104R.

Figure 8:
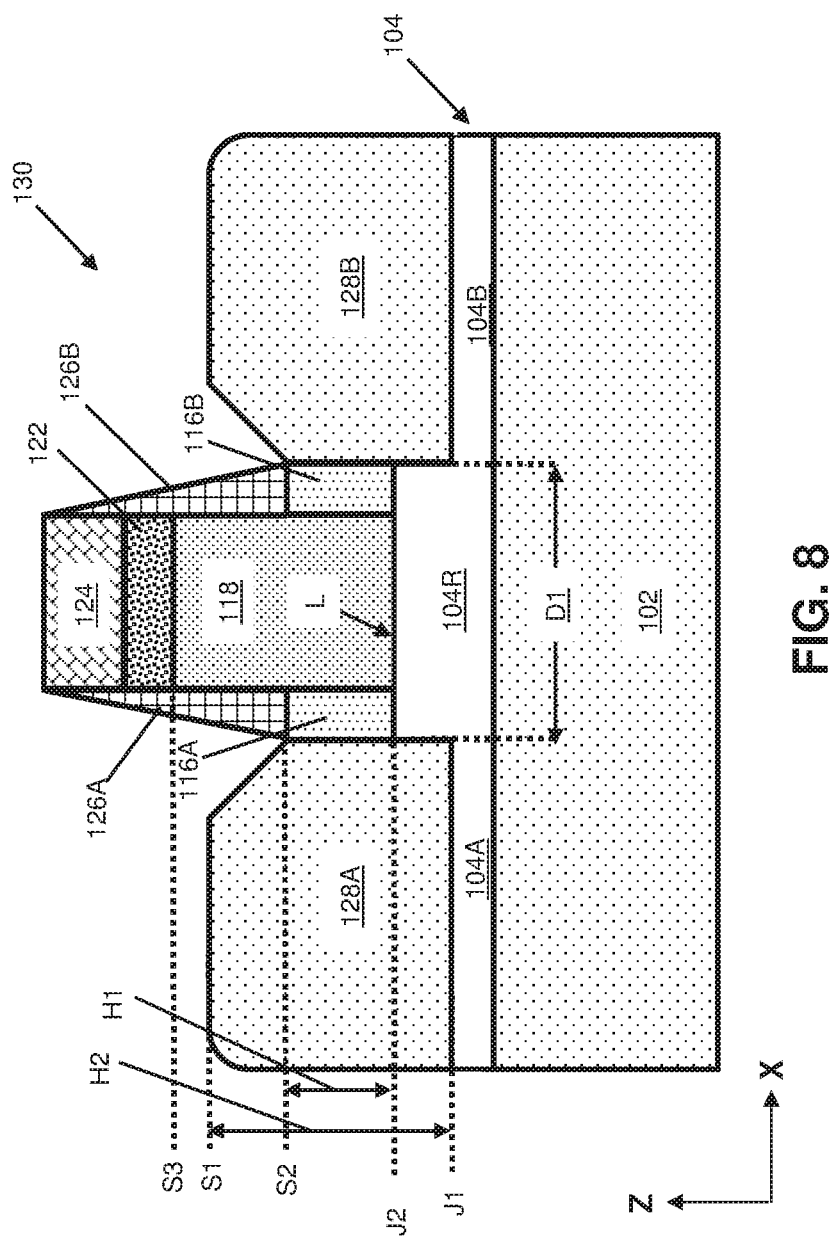
FIG. 8 shows a cross-sectional view of forming outer E/C material for an integrated circuit (IC) structure according to embodiments of the disclosure.

Referring now to FIG. 8, embodiments of the disclosure may include forming a first outer E/C material 128A on first region 104A of insulative layer 104, and a second outer E/C material 128B on second region 104B of insulative layer 104. Outer E/C materials 128A, 128B may be formed, e.g., by epitaxial growth and/or by being deposited onto the previously recessed first region 104A and second region 104B of insulative layer 104. In the case of epitaxial growth, outer E/C materials 128A, 128B may be grown horizontally outward from exposed portions of inner E/C materials 116A, 116B. Horizontal epitaxial growth of outer E/C materials 128A, 128B in some cases may cause outer E/C materials 128A, 128B to include tapered sidewalls alongside spacer(s) 126A, 126B. Outer E/C material(s) 128A, 128B may have a height H2 above insulator layer 104 that is greater than a height H1 of inner E/C material(s) 116A, 116B above insulator layer 104. The difference between heights H1, H2 may be attributed to, e.g., the difference in thickness between raised region 104R and region(s) 104A, 104B, and/or the epitaxial growth of outer E/C material(s) 128A, 128B. At least a portion of outer E/C materials 128A, 128B may be directly horizontally adjacent to and/or in contact with raised region 104R of insulative layer 104. Outer E/C materials 128A, 128B may include silicon, silicon germanium, and/or any other semiconductor material discussed elsewhere herein. Outer E/C materials 128A, 128B may be introduced with dopants to produce a same doping type as inner E/C materials 116A, 116B. In a more specific example, outer E/C materials 128A, 128B may be doped with N+ dopants while inner E/C materials 116A, 116B may include N− dopants.

The forming of outer E/C materials 128A, 128B may produce an IC structure 130 according to embodiments of the disclosure. IC structure 130 provides lower parasitic capacitance and/or internal resistance than conventional BJT structures. IC structure 130 may include, e.g., insulative layer 104 with first region 104A, second region 104B, and raised region 104R adjacent to and/or between region(s) 104A, 104B. Semiconductor base 118 may be located on a portion of an upper surface L of raised region 104R. Semiconductor base 118 of IC structure 130 thus includes sidewalls that are displaced from the corresponding sidewalls of raised region 104R.

As discussed elsewhere herein, first outer E/C material 128A may be located on first region 104A of insulative layer 104. Where applicable, second outer E/C material 128B may be located on second region 104B of insulative layer 104. First and/or second outer E/C materials 128A, 128B may exhibit height H2 above insulator layer 104. First inner E/C material 116A may extend horizontally between first outer E/C material 128A and semiconductor base 118. Second inner E/C material 116B, where applicable, may extend horizontally between second outer E/C material 128B and semiconductor base 118. First and/or second inner E/C materials 116A, 116B may have height H1 above insulator layer 104 that is less than height H2. Inner E/C material(s) 116A, 116B may extend horizontally in a first direction D1 across raised region 104R, e.g., in parallel with the X-axis as shown. First spacer 126A may overlie first inner E/C material 116A, and second spacer 126B may overlie second inner E/C material 116B. Overlying base 122 may be above (e.g., directly on) semiconductor base 118. Insulative cap 124, which may include BSG as discussed elsewhere herein, may be positioned over overlying base 122 and/or horizontally between spacers 126A, 126B.

The locations of outer E/C materials 128A, 128B, inner E/C materials 116A, 116B, and semiconductor base 118 thus may form a P-N-P or N-P-N junction through the electrical pathway from one outer E/C material 128A, 128B to the other. However, inner E/C materials 116A, 116B may have feature a vertical dimension that is significantly less than the corresponding height of semiconductor base 118 and outer E/C materials 128A, 128B. Thus, outer E/C materials 128A, 128B each may include an upper surface S1 that is above an upper surface S2 of inner E/C materials 116A, 116B. Upper surface S1 of outer E/C materials 128A, 128B may also be located below an upper surface S3 of semiconductor base 118. Similarly, a bottom surface J1 of outer E/C materials 128A, 128B may be located below a corresponding bottom surface J2 of inner E/C materials 116A, 116B. The reduced size of inner E/C materials 116A, 116B relative to semiconductor base 118 and outer E/C materials 128A, 128B, as well as the greater thickness of insulative layer 104 in raised region 104R, reduces the parasitic capacitance through inner E/C materials 116A, 116B during operation.

Figure 9:
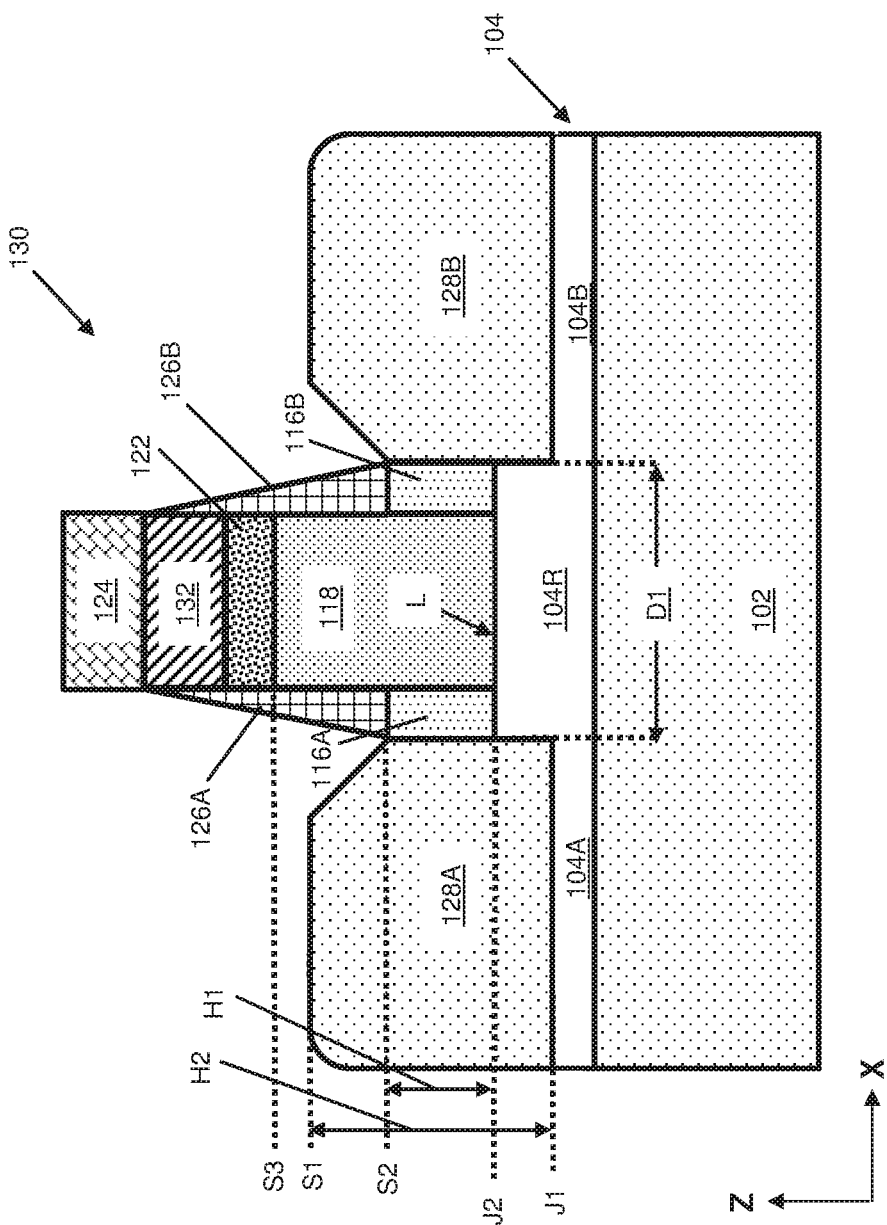
FIG. 9 shows a cross-sectional view of an IC structure with a silicide region according to embodiments of the disclosure.

FIG. 9 depicts further embodiments of IC structure 130. For example, IC structure 130 may include a silicide region 132 formed above, or directly on, overlying base 122 and/or semiconductor base 118. Silicide region 132 may include, e.g., one or more layers of conductive material formed using any now known or later developed technique on underlying semiconductor material (e.g., overlying base 122). Silicide region 132 may be formed, e.g., after the doping of semiconductor base 118 to form overlying base 122 but before the forming of insulative cap 124. Silicide region 132 may be formed by performing an in-situ pre-clean, depositing a metal such as titanium, nickel, cobalt, etc., annealing to have the metal react with silicon, and removing unreacted metal. Silicide region 132 thus may include one or more of tungsten silicide, tungsten nitride, titanium nitride, tantalum nitride, ruthenium oxide, cobalt silicide, and/or nickel silicide, depending on the type of metal deposited and annealed and/or the type of underlying semiconductor material(s) within overlying base 122 and/or semiconductor base 118. Where silicide region 132 is included, spacers 126A, 126B may be adjacent the sidewalls of silicide region 132. Additionally, insulative cap 124 may be positioned on silicide region 132 and/or above spacers 126A, 126B. In any case, silicide region 132 may be provided to increase the conductivity of an electrical pathway between semiconductor base 118 and one or more conductive contacts formed thereto.

Figure 10:
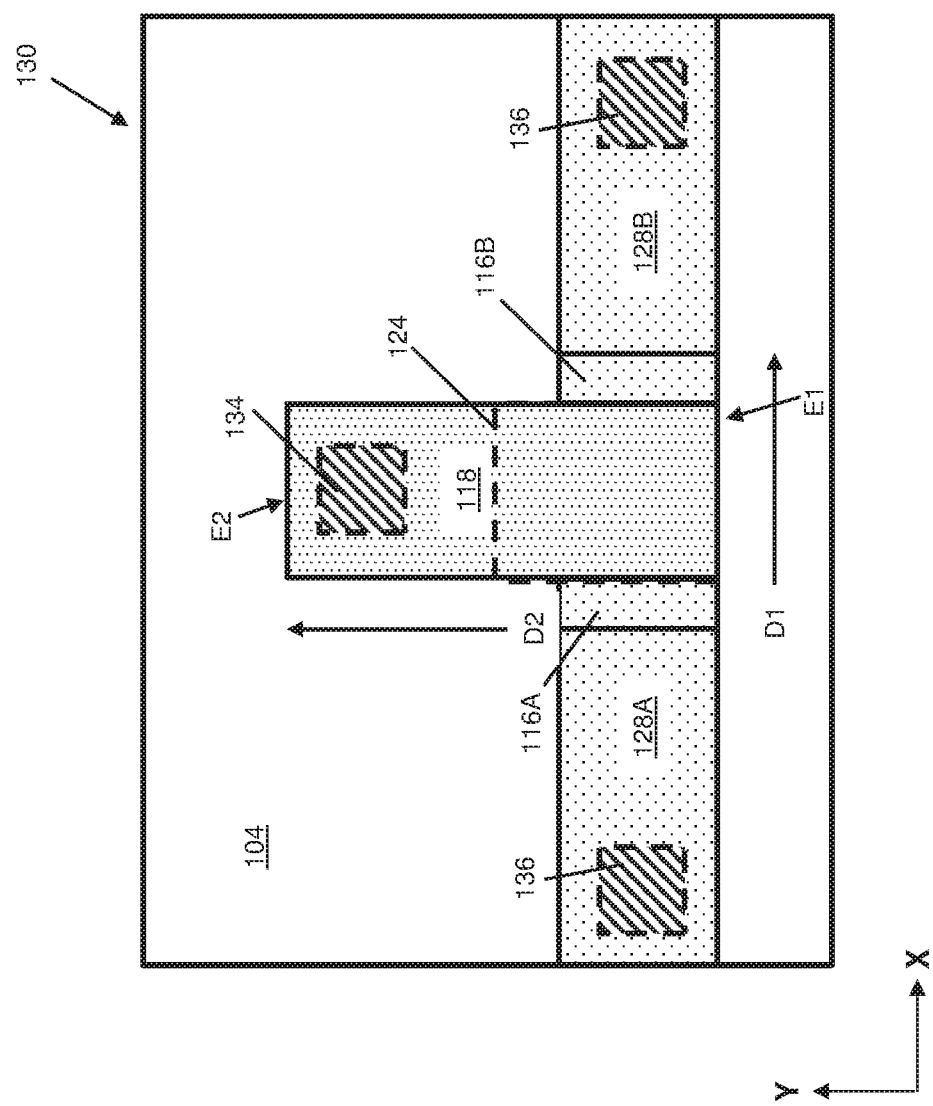
FIG. 10 shows a plan view in the X-Y plane of an IC structure according to embodiments of the disclosure.

Referring to FIGS. 8 and 10 together, embodiments of IC structure 130 may include various conductive contacts having a location and composition suitable to drive the operation of a BJT. As shown specifically in the plan view of FIG. 10, semiconductor base 118 may extend from a first end E1 thereof horizontally between the location of inner E/C materials 116A, 116B and outer E/C materials 128A, 128B to a second end E2 horizontally distal to materials 116A, 116B, 128A, 128B in a second direction D2. Second direction D2 may be orthogonal to first direction D1 in plane X-Y, as shown. Several structures overlying inner E/C materials 116A, 116B and semiconductor base 118 are omitted, and the location of insulative cap 124 is shown in phantom, solely for the sake of explanation.

IC structure 130 may include a base contact 134 to semiconductor base 118, and/or alternatively to overlying base 122 or silicide region 134 (FIG. 8) thereover. Base contact 134 may include one or more conductive materials formed on and/or partially on semiconductor base 118, e.g., one or more conductive metals and/or conductive silicide regions. Base contact 134 additionally may include, e.g., refractory metal liners (not shown) to horizontally separate conductive materials of base contact 134 from adjacent insulators (not shown) and/or other horizontally adjacent materials. Such liners may include materials such as but not limited to: tantalum nitride (TaN) and tantalum; tantalum nitride, tantalum and cobalt; and magnesium (Mn), or combinations thereof. To form electrical connections to emitter and base terminals of IC structure 130, a set of E/C contacts 136 may be formed to outer E/C materials 128A, 128B. E/C contacts 136 may include the same similar conductive materials to those used in base contact 134. In any case, base contact 134 may be horizontally separated from E/C contacts 136 in second direction D2, while E/C contacts 136 may be horizontally separated from each other in first direction D1.

Embodiments of the disclosure may provide several technical and commercial advantages, some of which here discussed herein by way of example. As noted throughout the disclosure, the inclusion of raised region 104R of insulative layer 104 may provide a lower parasitic capacitance than conventional IC structures which lack raised region 104R, and/or the various E/C materials 116A, 116B, 128A, 128B formed thereon. Additionally the location of overlying base 122 and/or silicide region 132 may further reduce the intrinsic resistance of the base region of the BJT, particularly where overlying base 122 includes P+ doping and semiconductor base 118 includes P− doping. The configuration of IC structure 130 also permits an array of BJTs to be formed in consecutive rows, with base contacts to each BJT being located horizontally between the consecutive rows (e.g., in second direction D2 as shown in FIG. 10). Related benefits to such an arrangement include, e.g., allowing all emitter terminals of IC structure 130 to be connected to a single metal level through E/C contact(s) 136 while all collector terminals and base terminals of IC structure 130 may be connected to another single metal level through base contact(s) 134 and/or E/C contact(s) 136. Each of the various features discussed herein are also easily integrated into conventional processing paradigms to form BJTs in an IC structure.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit (IC) structure, comprising:
an insulative layer on a top surface of a substrate, and including a non-raised region horizontally adjacent a raised region having a top surface above a top surface of the non-raised region;
a semiconductor base on a first portion of the raised region of an insulative layer;
a first inner emitter/collector (E/C) material on a second portion of the raised region of the insulative layer, wherein the first inner E/C material is directly horizontally between the semiconductor base and a first sidewall of the raised region;
a first outer E/C material on the first non-raised region of the insulative layer and including a pair of opposing sidewalls, wherein an upper portion of the first outer E/C material is horizontally adjacent the first inner E/C material, and a lower portion of the first outer E/C material is horizontally adjacent the raised region of the insulative layer; and
a first spacer on the first inner E/C material, and including a pair of sidewalls each vertically aligned with one of the pair of opposing sidewalls of the first inner E/C material,
wherein a vertical thickness of the non-raised region of the insulative layer defines a vertical separation between the first outer E/C material and the substrate, and a vertical thickness of the raised region of the insulative layer defines a vertical separation between the first inner E/C material and the substrate.

2. The IC structure of claim 1, further comprising:
a second inner emitter/collector (E/C) material on a third portion of the raised region, wherein the second inner E/C material is directly horizontally between the semiconductor base and a second sidewall of the raised region opposite the first sidewall; and
a second outer E/C material on a second non-raised region of the insulative layer, wherein an upper portion of the second outer E/C material is adjacent the second inner E/C material.

3. The IC structure of claim 1, further comprising:
an overlying base on the semiconductor base; and
an insulative cap on the overlying base.

4. The IC structure of claim 3, wherein the first outer E/C includes an upper surface above an upper surface of the first inner E/C material, and a lower surface below a lower surface of the first inner E/C material.

5. The IC structure of claim 1, wherein the semiconductor base is of a first doping type, and wherein each of the first inner E/C material and the first outer E/C material are of a second doping type opposite the first doping type.

6. The IC structure of claim 5, wherein the first doping type is an N-type doping, wherein second doping type is a P-type doping, the first and second outer E/C materials are N+ doped, and wherein the first and second inner E/C materials are N− doped.

7. The IC structure of claim 4, wherein the first doping type is a P-type doping, wherein second doping type is an N-type doping.

8. An integrated circuit (IC) structure, comprising:
an insulative layer on a top surface of a substrate, and including a non-raised region horizontally adjacent a raised region having a top surface above a top surface of the non-raised region;
a semiconductor base on the insulative layer, wherein the semiconductor base includes P− doping;
an overlying base on the semiconductor base, wherein the overlying base includes P+ doping;
a first inner emitter/collector (E/C) material on the insulative layer horizontally adjacent a first sidewall of the semiconductor base;
a first spacer on the first inner E/C material, and including a pair of sidewalls each vertically aligned with one of the pair of opposing sidewalls of the first inner E/C material; and
a first outer E/C material on the insulative layer horizontally adjacent the first inner E/C material, wherein a height of the first outer E/C material above the insulative layer is greater than a height of the first inner E/C material above the insulative layer, and wherein a top surface of the first outer E/C material is below a bottom surface of the overlying base,
wherein a vertical thickness of the non-raised region of the insulative layer defines a vertical separation between the first outer E/C material and the substrate, and a vertical thickness of the raised region of the insulative layer defines a vertical separation between the first inner E/C material and the substrate.

9. The IC structure of claim 8, further comprising:
a second inner E/C material adjacent a second sidewall of the semiconductor base, opposite the first sidewall; and
a second outer E/C material on the insulative layer adjacent the second inner E/C material, wherein a height of the second outer E/C material above the insulative layer is greater than a height of the second inner E/C material above the insulative layer.

10. The IC structure of claim 9, further comprising:
a silicide region directly on an upper surface of the overlying base;
an insulative cap on the overlying base; and
a second spacer on the second inner E/C material, wherein the second spacer is adjacent the semiconductor base, the overlying base, and the silicide region.

11. The IC structure of claim 8, wherein the first outer E/C material includes an upper surface above an upper surface of the first inner E/C material, and a lower surface below a lower surface of the first inner E/C material.

12. The IC structure of claim 8, wherein the semiconductor base is of a first doping type, and wherein each of the first inner E/C material and the first outer E/C material are of a second doping type opposite the first doping type.

13. The IC structure of claim 12, wherein the first doping type is an N-type doping, and wherein the second doping type is a P-type doping.

14. The IC structure of claim 12, wherein the first doping type is an P-type doping, wherein second doping type is a N-type doping.

15. A method of forming an integrated circuit (IC) structure, the method comprising:
providing a structure including:
an insulative layer on a substrate, the insulative layer including a first region and a second region adjacent the first region,
a semiconductor base on a portion of an upper surface of the first region of the insulative layer,
a first inner emitter/collector (E/C) material on the portion of the upper surface of the first region of the insulative layer and adjacent a first sidewall of the semiconductor base, and including a pair of opposing sidewalls, and a first spacer on the first inner E/C material, and including a pair of sidewalls each vertically aligned with one of the pair of opposing sidewalls of the first inner E/C material;

partially recessing the second region of the insulative layer above the substrate to convert the first region of the insulative layer into a raised region adjacent the second region; and forming an outer E/C material on the recessed second region of the insulative layer, wherein the first outer E/C material is directly adjacent the first inner E/C material, a vertical thickness of the non-raised region of the insulative layer defines a vertical separation between the first outer E/C material and the substrate, and a vertical thickness of the raised region of the insulative layer defines a vertical separation between the first inner E/C material and the substrate.

16. The method of claim 15, further comprising:

partially recessing a third region of the insulative layer above the substrate, the first region being horizontally between the second region and the third region, such that the raised region is between the recessed second region and the recessed third region;

forming a second inner E/C material on another portion of the upper surface of the raised region of the insulative layer and adjacent a second sidewall of the semiconductor base; and forming a second outer E/C material on the recessed third region of the insulative layer, wherein the second outer E/C material is directly adjacent the second inner E/C material.

17. The method of claim 15, further comprising:

introducing dopants into semiconductor base, the introduced dopants having a first doping type; and forming an insulative cap on the semiconductor base.

18. The method of claim 16, further comprising introducing dopants of a second doping type into each of the first inner E/C material and the first outer E/C material, wherein the second doping type is opposite the first doping type.

19. The method of claim 15, wherein forming the first outer E/C material includes epitaxially growing the first outer E/C material to a height above an upper surface of the first inner E/C material, and below and upper surface of the semiconductor base.

20. The method of claim 15, further comprising forming a base contact to the semiconductor base, wherein the semiconductor base extends horizontally between the base contact and the first inner E/C material in a direction orthogonal to a horizontal separation between the semiconductor base and the first outer E/C material.

* * * * *